United States Patent [19]

Michael

[11] 3,868,678

[45] Feb. 25, 1975

[54] ANALOGUE-TO-DIGITAL CONVERTORS

[75] Inventor: Peter Colin Michael, Newbury, England

[73] Assignee: Micro Consultants Limited, Newbury, England

[22] Filed: Aug. 7, 1973

[21] Appl. No.: 386,341

[30] Foreign Application Priority Data

Aug. 10, 1972 Great Britain .................. 37390/72

[52] U.S. Cl. ..................... 340/347 AD, 340/347 SH

[51] Int. Cl. ........................................... H03k 13/02

[58] Field of Search ................ 340/347 AD, 347 SH

[56] References Cited

UNITED STATES PATENTS

| | | | |
|---|---|---|---|
| 3,329,950 | 7/1967 | Shafer | 340/347 |
| 3,599,204 | 8/1971 | Severin | 340/347 AD |
| 3,641,562 | 2/1972 | Kobayashi et al. | 340/347 AD |
| 3,644,924 | 2/1972 | Kitaguchi et al. | 340/347 AD |

*Primary Examiner*—Felix D. Gruber
*Assistant Examiner*—Vincent Sunderick
*Attorney, Agent, or Firm*—William Anthony Drucker

[57] ABSTRACT

An analog-to-digital converter comprises a series connected chain of encoder bits adapted to provide a digital output signal indicative of the amplitude of an applied sampled analog signal. A plurality of storage elements are connected respectively to the outputs of said encoder bits to receive the signals therefrom in response to a triggering signal from a triggering source. Delay elements are provided to delay progressively the storage of the output signal from respective ones of said encoder bits to compensate for propagation delay in the chain to effect storage of a digital signal indicative of an instantaneous level of the analog signal.

7 Claims, 8 Drawing Figures

ANALOGUE-TO-DIGITAL CONVERTORS

BACKGROUND TO THE INVENTION

This invention relates to analogue-to-digital signal convertors.

An analogue-to-digital convertor is already known which uses a series of identical or similar elements each of which produces a logic output together with an analogue output which may be passed to the next stage. The stages generally have the characteristics of one of two different types, i.e. binary code or Gray code. In general the logic outputs from each of the stages are latched in registers upon a single 'clock command. ' The register then stores the states of each of the bits at that moment in time.

If a step change is applied at the input the time for the logic output to settle to their final value is determined by two functions which may be conveniently separated.

The first of these functions is the bandwidth of each particular bit. The bandwidth of the complete equipment may be approximated by taking the square root of the number of bits and multiplying it by the bandwidth of each bit if they are similar. This particular invention makes no improvement to the bandwidth performance.

The second characteristic is one of propagation delay between each bit. There is a finite time between the application of an analogue input and the logic output changing on that particular bit. Furthermore, there is a finite time between the analogue input changing and the analogue output changing. This time may be described as the "propagation" delay of each bit. The propagation delay has a significant effect upon the performance of the convertor and limits the rate at which inputs may be changed without causing an error in some stages of the convertor.

A special object of the invention is to reduce the effects of propagation delay so that the principal performance is then determined by the bandwidth of each bit.

SUMMARY OF INVENTION

According to the invention an analogue-to-digital signal convertor comprises a plurality of encoder bits connected in a series combination and adapted to provide a digital output signal indicative of the amplitude of an applied analogue signal, a storage device having a plurality of storage elements, each element being influenced by the output signal of a respective one of said encoder bits in response to a triggering signal from a triggering source, and delay means external of said encoder bits effective to delay progressively storage of the output signal from respective ones of said encoder bits to compensate for propagation delay in the encoder bits to effect storage of a digital signal indicative of an instantaneous level of the analogue signal.

Further according to the invention, we provide a method of converting an analogue signal to a digital form involving the steps of feeding the analog signal to a first encoder bit, providing a digital output from the encoder bit indicative of the magnitude of the analog signal and providing an analog signal output from said encoder bit, feeding the analog output successively via at least one additional encoder bit functioning similarly to the first encoder bit, feeding the digital output of each encoder bit to a respective storage element, and triggering the storage elements to effect storage of progressively delayed signals from respective digital outputs of the encoder bits to compensate for propagation delay in the encoder bits, said signals being indicative of the instantaneous level of the signal.

BRIEF DESCRIPTION OF DRAWINGS

Embodiments of the invention will now be described by way of example with reference to the accompanying drawings wherein.

DESCRIPTION OF PREFERRED EMBODIMENT

Figure 1:
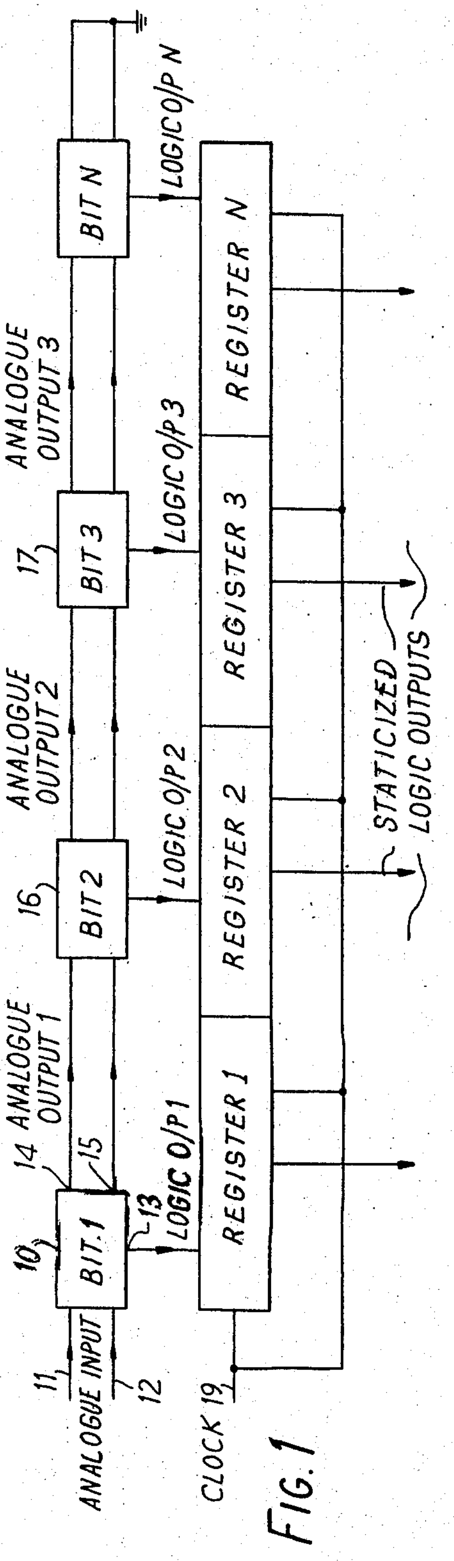
FIG. 1 is a block diagram of a known analogue-to-digital convertor.
Figure 6:
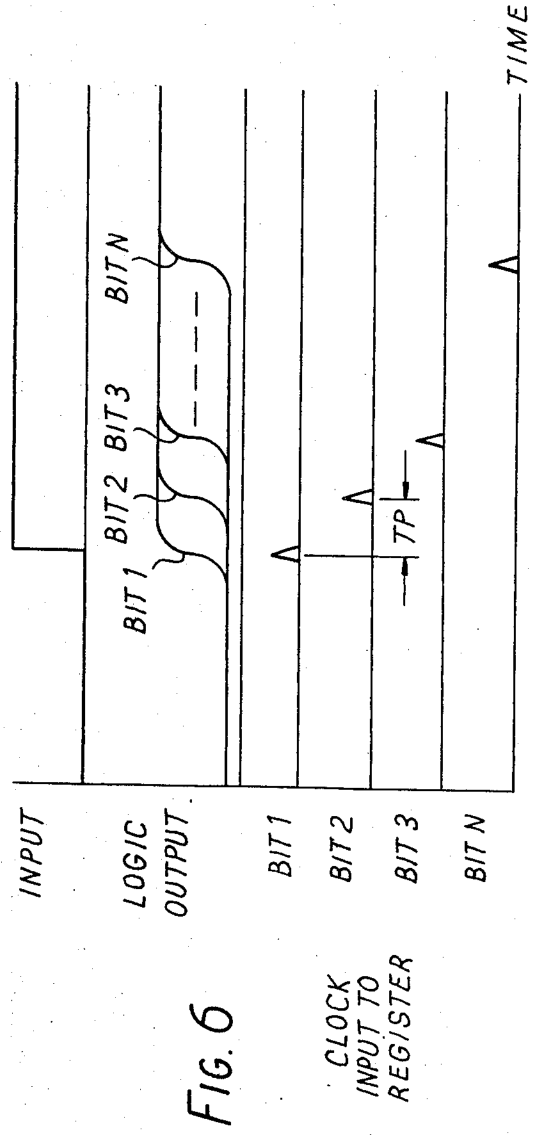
FIG. 6 is a graphical illustration showing on a voltage/time graph the operation of an arrangement which provides a digital signal in binary code.
Figure 7:
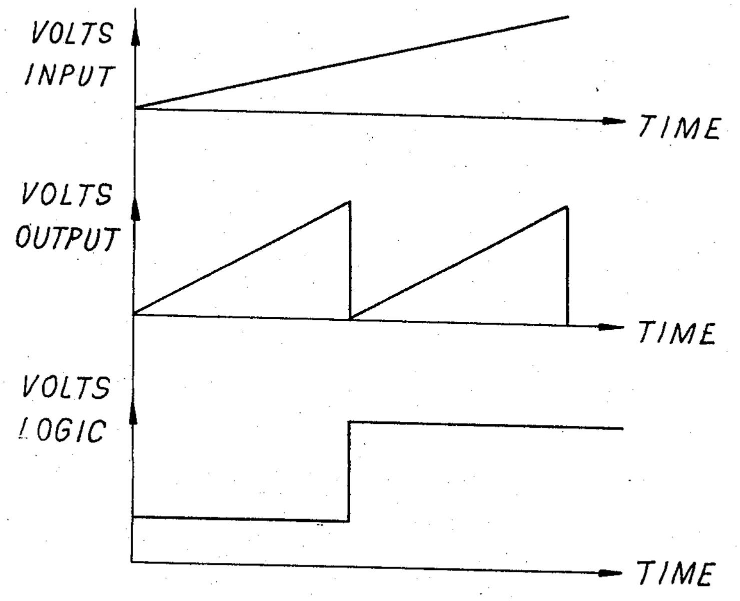
FIG. 7 is a graphical illustration showing on a voltage/time graph the operation of an arrangement which provides a digital signal in Gray code.
Figure 8:
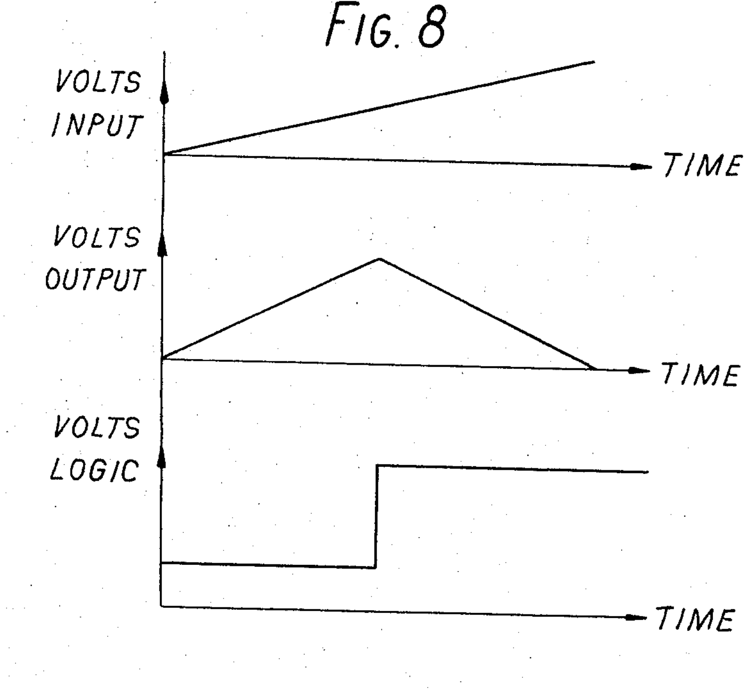
FIG. 8 is a graphical illustration similar to FIG. 7 for an arrangement in which the analogue output signal change from each binary element is reversed after each digit change.

A general form of a known encoder is shown in FIG. 1. A first binary element 10 which provides the first encoder bit of a digital signal accepts an analogue input signal at input terminals 11 and 12 and produces a logic output signal from output terminal 13 dependant upon the storage level together with a further analogue output signal from output terminals 14 and 15 which is passed to a second binary element 16 which indicates the second bit. The second binary element 16 produces a logic output together with an analogue output which is fed to the third binary element 17 in a similar manner. This process is continued for the number of bits to be encoded. In this particular diagram bit N is shown as the last bit. Each of the binary elements will have a signal format shown in either FIG. 6 or FIG. 7. If the bit has an input to output characteristic similar to that in FIG. 6, the code produced at the logic outputs will be pure binary. If the bit has a format with an input to output characteristic as shown in FIG. 7, the logic output will have a Gray code format. The Gray code format may be easily converted to binary format and vice versa. There are particular advantages associated with each of the types and this invention relates to a method of improving the performance of both types.

Figure 2:
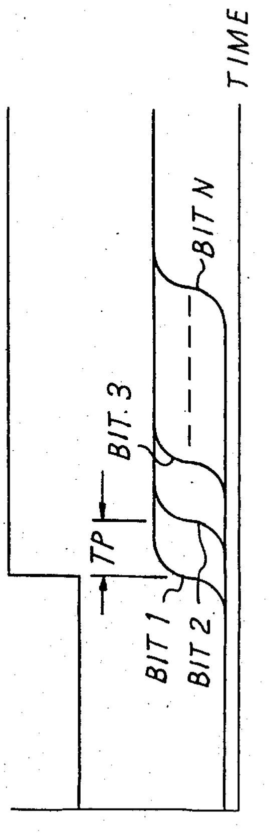
FIG. 2 is a graphical illustration of analogue input voltage and logic output voltage from each bit plotted on a time axis for the arrangement of FIG. 1.

FIG. 2 illustrates the propagation delay effect upon the logic outputs when a step analogue input is applied to the system. The total propagation delay between the first input changing and the last input changing is (N−1) TP.

Figure 3:
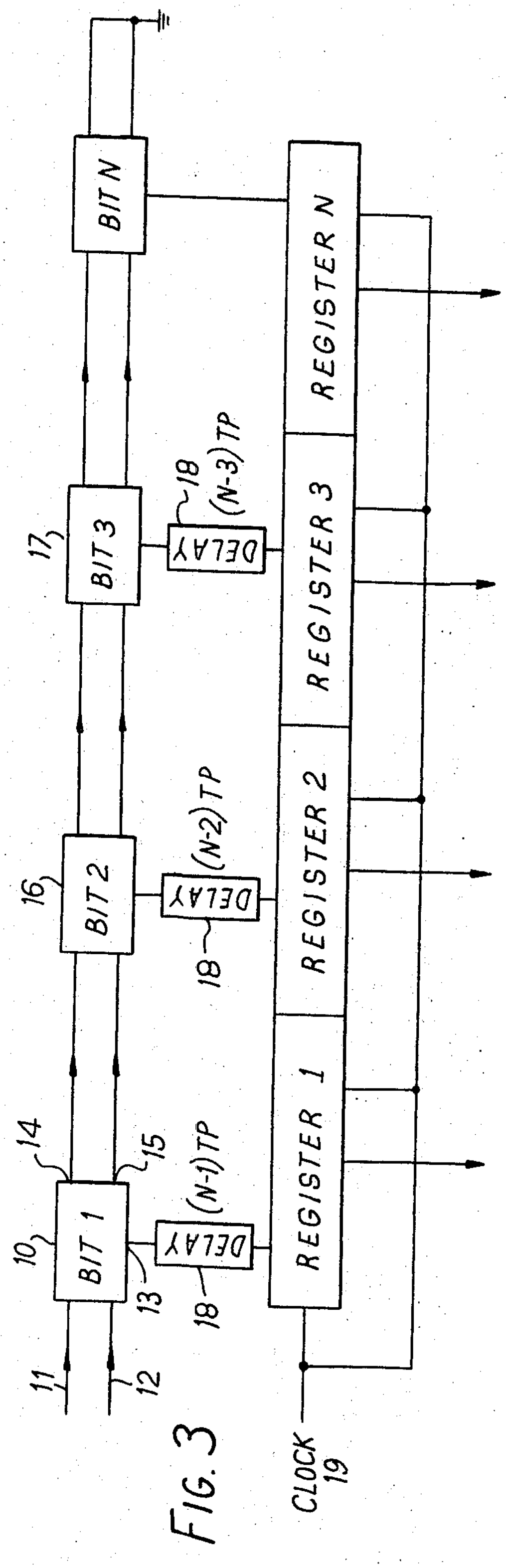
FIG. 3 is a block diagram of one embodiment of the invention.
Figure 4:
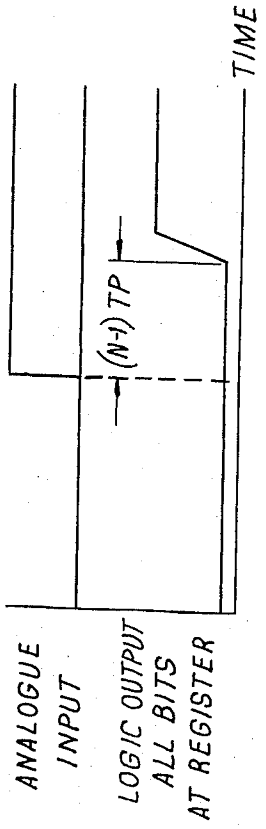
FIG. 4 is a graphical illustration of analogue input voltage and logic signal voltage at the input to the storage devices (or registers) plotted on a time axis for the arrangement of FIG. 3.

Where: N is the number of bits and TP is the propagation time between each bit. In the encoder of the present invention shown in FIG. 3 there is provided as before a series of bits 10,16,17 etc. formed by binary elements wherein a time delay is introduced by means of delay elements 18 in the path of the logic signal from each bit to its storage element or register 1,2,3, etc. The time delay is made dependent upon the position of the bit in the chain with the longest time delay being applicable to the first bit. The intention is that at the register end of the time delays all of the logic signals relating to an instantaneous value of the analogue signal will appear at the same moment coincident in time. Whereas they start off at the encoder end of the time delays at different moments in time. FIG. 4 shows the effect of the time delays introduced in this manner. When a step change is applied to the input of the encoder there is a propagation delay of (N−1) TP before any change appears at the register. After that period has elapsed the data may be strobed into the register by a triggering pulses from the clock 19. This system has the advantage that a further step may be applied to the input of the encoder before the last change has been stored in the register as there is data stored in the delay line. It would thus have been possible to take a sample immediately before (N−1) TP which had been caused by some previous step change. The effect of the delay line has thus been to increase the throughput of the encoder by eliminating the effect of propagation delay.

Figure 5:
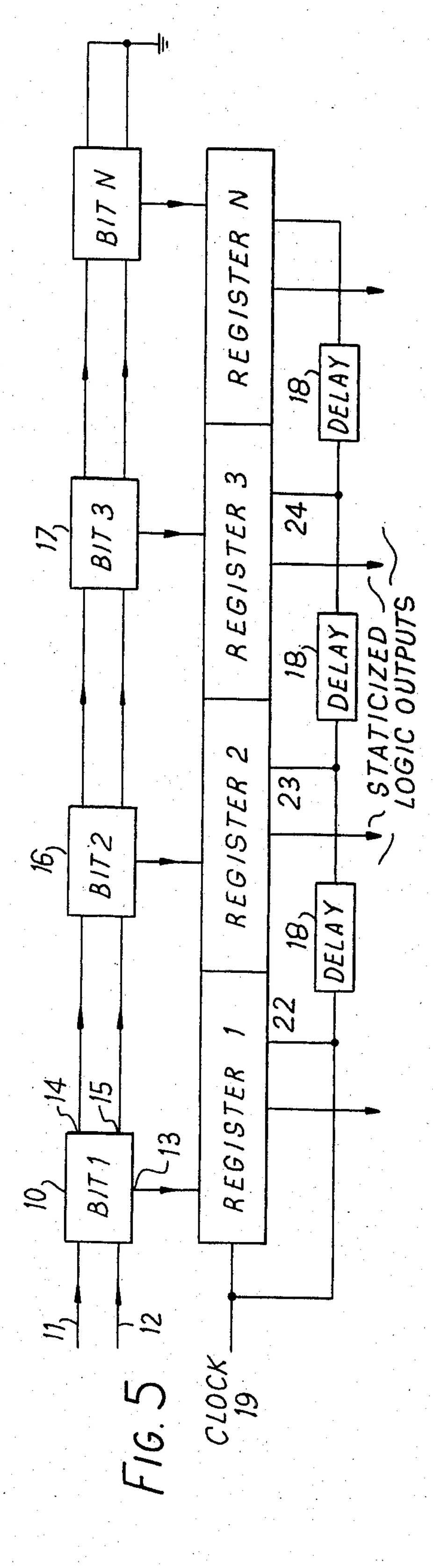
FIG. 5 is a block diagram of an alternative embodiment of the invention.

FIG. 5 shows another form of the invention for achieving a similar effect and comprises a series of bits 10, 16, 17, N and registers 1, 2, 3, N but this time uses a single delay line comprising a series of delay elements 18 to strobe or trigger the data into the stores 1, 2, 3, N at a different preiod of time coincident with the settling time of each encoder bit. FIG. 6 shows a delay of TP between the pulses on each register or storage element received from the clock 19. Thus a clock pulse is applied at the input 22 to the first register 1 and after a propagation delay of TP is applied to the input 23 of the second register or storage element 2. The clock pulse from the clock 19 will thus propagate down the delay line with a propagation delay period of TP between each register stage. FIG. 6 illustrates the effect of this delay line on the various waveforms. The effect is that the final data stored in each register is consistent with the input step change although the initial clock pulse has occurred before the final bit has started its transition from one state to another. The general effect of both of these arrangements is to treat the encoder as a delay line with known characteristics. The system may then have more than one digitization in progress at the same time without interacting with either the previous digitization or the next digitization. In practice a video delay cable may be used or lumped delay time constants or logic elements only with suitable delay components to produce the time delay necessary.

It will be obvious that the storage elements need not be triggered by a clock signal. Any other suitable triggering arrangement may be employed for example a system may be provided where the storage element is triggered when a particular significant digit of the output signal from the binary elements changes.

I claim:

1. An analogue-to-digital convertor, comprising a. a plurality of encoder bits connected in a series combination and adapted to operate asynchronously and to provide a digital output signal indicative of the amplitude of an applied analogue signal, b. a storage device having a plurality of storage elements, each element being influenced by the output signal of a respective one of said encoder bits in response to a triggering signal from a triggering source, and c. external of said encoder bits effective to delay progressively storage of the output signal from respective ones of said encoder bits to compensate for propagation delay in the encoder bits to effect storage of a digital signal indicative of an instantaneous level of the analogue signal.

2. An analogue-to-digital convertor according to claim 1 wherein said delay means comprises a delaying element for each encoder bit except the last in the series combination, which elements are connected between a respective encoder bit and its storage element and are effective to introduce a time delay in delivery of the digital signal between the output of each encoder bit and its respective storage element, whereby at any instant signals are available at the inputs of each of the storage elements, which signals correspond to an instantaneous level of the analogue signal.

3. An analogue-to-digital convertor according to claim 1, including a triggering signal line containing said storage element and wherein said delay means comprises delaying elements connected in series between successive storage elements, which delaying elements are effective to delay progressively a triggering signal from the triggering source to delay triggering of each storage element until a digital signal indicative of an instantaneous signal level is received at the triggering input of said element.

4. An analogue-to-digital convertor according to claim 1 wherein said triggering source comprises a clock generator which provides regular pulses to effect regular sampling and storage of the digital output signal.

5. A method of converting an analogue signal into digital form comprising the steps of a. feeding the analogue signal to a first encoder bit, b. providing a digital output from the encoder bit indicative of the magnitude of the analogue signal and providing an analogue signal output from said encoder bit, c. feeding the analogue output successively via at least one additional encoder bit functioning similarly to the first encoder bit, d. feeding the digital output of each encoder bit to a respective storage element external of said encoder bits, and e. triggering the storage elements to effect storage of progressively delayed signals from respective digital outputs of the encoder bits to compensate for propagation delay in the encoder bits, said signals being indicative of the instantaneous level of the analog signal.

6. A method according to claim 5 wherein the digital output signal from each encoder bit except the last is delayed before it reaches the respective storage element so that at any instant the signals appearing at an input to each storage element correspond to an instantaneous level of the analogue signal.

7. A method according to claim 5 wherein a triggering signal may be progressively delayed before being applied to successive storage elements to effect progressive triggering of the storage elements to compensate for propagation delay of the encoder bits and effect storage of a digital signal indicative of an instantaneous value of the analogue signal.

* * * * *